(12) United States Patent
Chrudimsky

(10) Patent No.: US 7,446,566 B1
(45) Date of Patent: Nov. 4, 2008

(54) LEVEL SHIFTER

(75) Inventor: David Chrudimsky, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/873,099

(22) Filed: Oct. 16, 2007

(51) Int. Cl.
*H03K 19/094* (2006.01)
*H03K 19/0175* (2006.01)
*H03L 5/00* (2006.01)

(52) U.S. Cl. .................................. 326/68; 327/333
(58) Field of Classification Search ............ 326/62, 326/63, 68, 81, 82, 83; 327/108, 109, 333
See application file for complete search history.

(56) References Cited

U.S. PATENT DOCUMENTS

| | | | |
|---|---|---|---|
| 4,486,670 A * | 12/1984 | Chan et al. ............. 326/81 |
| 5,321,324 A * | 6/1994 | Hardee et al. ........... 326/62 |
| 5,781,026 A | 7/1998 | Chow |
| 6,556,061 B1 | 4/2003 | Chen et al. |
| 6,791,391 B2 * | 9/2004 | Nishimura et al. ........ 327/333 |
| 7,053,656 B2 | 5/2006 | Seo |
| 7,176,740 B2 * | 2/2007 | Tachibana et al. ......... 327/333 |

* cited by examiner

*Primary Examiner*—Rexford Barnie
*Assistant Examiner*—Dylan White
(74) *Attorney, Agent, or Firm*—James L. Clingan, Jr.; Daniel D. Hill

(57) ABSTRACT

A level shifter circuit includes first and second cross-coupled P channel transistors, first and second cross-coupled N channel transistors, and first and second inverters. The first and second P channel transistors are coupled to receive a first power supply voltage. The first and second cross-coupled N channel transistors are coupled to the first and second P channel transistors. The first and second inverters are coupled to the first and second N channel transistors and are coupled to receive a second power supply voltage that is lower than the first power supply voltage. The first and second N channel transistors have a lower, substantially zero volts, threshold voltage and can be controlled by a low voltage signal while limiting a leakage current.

20 Claims, 1 Drawing Sheet

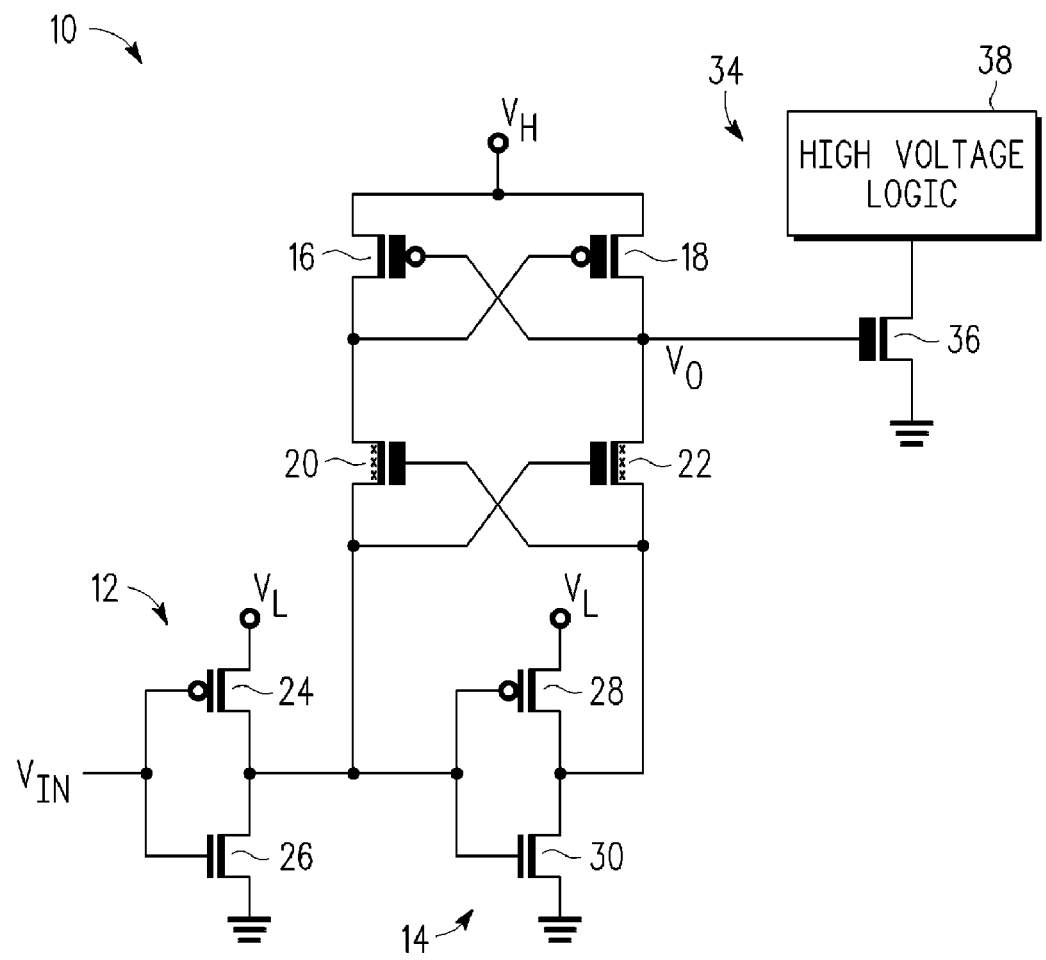
FIGURE

LEVEL SHIFTER

BACKGROUND

1. Field

This disclosure relates generally to circuits, and more specifically, to level shifters.

2. Related Art

Level shifters are commonly used in logic circuits because there are many cases where different power supply voltages are used to power different functions. One common application is programming voltages for non-volatile memories (NVMs). The programming voltage must be selectively supplied so that logic circuitry is involved but the programming voltage exceeds the breakdown voltage of the transistors used for the logic. Also it is typically desirable to use as relatively low voltage whenever possible to save power and reduce issues with heat generation.

Accordingly, there is a need for efficiently converting a logic signal supplied at one voltage level to a logic signal provided at a different voltage level.

BRIEF DESCRIPTION OF THE DRAWINGS

The present invention is illustrated by way of example and is not limited by the accompanying FIGURE, in which like references indicate similar elements. Elements in the figures are illustrated for simplicity and clarity and have not necessarily been drawn to scale.

The sole FIGURE is a combination circuit diagram and block diagram according to an embodiment.

DETAILED DESCRIPTION

In one aspect, a level shifter provides for cross-coupled input transistors and cross-coupled output transistors to provide a conversion from logic provided at one voltage level to logic provided at another voltage level. This is particularly beneficial when high voltage N channel transistors are made with relatively high threshold voltages for the necessary high voltage operations, but additional high voltage N channel transistors can be made at minimal extra cost with near-zero threshold voltage. In such case the near-zero threshold devices, even if they have a slightly negative threshold voltage, can be used as the cross-coupled input transistors and will be ensured of being conductive even at low logic high input levels while also being ensured of being non-conductive due to the cross-coupled arrangement of their gates and sources. This is better understood by reference to the drawings and the following description.

Shown in the sole FIGURE is a level shifter 10 and a circuit 34 on an integrated circuit. Level shifter 10 comprises an inverter 12, an inverter 14, a P channel transistor 16, a P channel transistor 18, an N channel transistor 20, and an N channel transistor 22. Circuit 34 comprises a high voltage logic circuit 38 and an N channel transistor 36. Inverter 12 comprises a P channel transistor 24 and an N channel transistor 26. Inverter 14 comprises a P channel transistor 28 and an N channel transistor 30. N channel transistors 26 and 30 and P channel transistors 24 and 28 are low voltage logic transistors which means they have gate dielectrics that are thin and sources and drains that are close to each other. They may even have the thinnest gate dielectrics and the closest source/drains on the integrated circuit. They are made to be small in order to occupy less space and have faster operation. They also must have a low power supply voltage, VL, which also has the beneficial effect of reducing power. N channel transistors 20, 22, and 36 and P channel transistors 16 and 18, on the other hand, are high voltage devices which have thick gate dielectrics and normally have long source/drain spacing. N channel transistor 36 is a conventional high voltage transistor whereas N channel transistors 20 and 22 have a near-zero threshold voltage. An exemplary range is –0.2 to 0.3 volt. The threshold voltage of high voltage N channel transistor 36 is chosen by a threshold implant. This threshold voltage is chosen for the particular circuits that need the high voltage capability and may be around one volt. During this implant, the implant is blocked from reaching N channel transistors 20 and 22 which results in them having a near-zero threshold voltage. Because this threshold voltage implant will have to be blocked from the non N channel high voltage transistors such as the logic transistors and the high voltage P channel transistors, there should be no incremental cost in also blocking some of the high voltage N channel transistors. Because the one volt threshold voltage may be too high for reliably responding to a logic high voltage from the low voltage transistors, transistors 20 and 22, which are cross coupled input transistors for level shifter 10, are of the low threshold voltage type of N channel high voltage transistor.

Transistor 26 has a gate for receiving an input signal Vin, a source coupled to a negative power supply terminal shown as ground in this case, and a drain. Transistor 24 has a gate for receiving input signal Vin, a drain connected to the drain of transistor 26, and a source connected to a positive power supply terminal VL, which is for providing a low voltage useful for low voltage circuits. Transistor 30 has a gate connected to the drains of transistors 24 and 26, a source coupled to the negative power supply terminal, and a drain. Transistor 28 has a gate connected to the drains of transistors 24 and 26, a drain connected to the drain of transistor 28, and a source connected to the positive power supply terminal VL. The gates of transistors 24 and 26 function as an input of inverter 12, and the drains function as an output of inverter 12. The gates of transistors 28 and 30 function as an input of inverter 14, and the drains function as an output of inverter 14. Transistor 20 has a source connected to the output of inverter 12, a gate connected to the output of inverter 14, and a drain. Transistor 22 has a source connected to the output of inverter 14, a gate connected to the output of inverter 12, and a drain. Transistor 16 has a drain connected to the drain of transistor 20, a gate connected to the drain of transistor 22, and a source connected to a positive power supply voltage VH, which is for providing a high voltage useful for high voltage circuits. Transistor 18 has a drain connected to the drain of transistor 22, a gate connected to the drain of transistor 20, and a source connected to positive power supply terminal VH. The drains of transistors 18 and 22 form the output of level shifter 10 which provides an output signal VO. Transistor 36 has a gate that receives the output of level shifter 10, a source connected to the negative power supply terminal, and a drain connected to high voltage logic circuit 38.

In operation, inverter 12 receives signal Vin and provides a logic inversion. For the case where Vin is a low-voltage logic high, inverter 12 provides a logic low. A low-voltage logic high in this case would be a voltage from power supply terminal VL. A logic high must be a high enough voltage to cause an N channel transistor 26 to become conductive. Due to loading and other parasitic effects, the actual voltage of signal Vin received by transistor 26 may be significantly less than the voltage at positive power supply terminal VL. It may be lower, for example, than the threshold voltage of transistor 36. The logic low provided by inverter 12 applies ground to the source of transistor 20 and the gate of transistor 22 and causes inverter 14 to provide a logic high from power supply terminal VL (a VL logic high) to the gate of transistor 20 and the source of transistor 22. This results in transistor 20 having a gate to source bias by a voltage at or near the voltage at power supply terminal VL. The voltage at power supply terminal VL is certain to exceed the near-zero threshold voltage of transistor 20 so that transistor 20 will be certain to be conductive. The gate to source voltage on transistor 22, on the other hand, will be a negative bias because the source of transistor will be at a voltage at or near the voltage at power supply terminal VL and the gate will be grounded. Thus, transistor 22 is ensured of being non-conductive even if it has a threshold voltage that is a little negative. With transistor 20 conductive and its source coupled to ground, the drain can draw current and result in a logic low at the gate of transistor 18 causing transistor 18 to become conductive. With transistor 22 non-conductive and transistor 18 conductive, a logic high occurs on the gate of transistor 16 causing it to be non-conductive. Thus, Transistor 18 provides a logic high at or near the voltage at positive power supply terminal VH (a VH logic high) to as signal VO to the gate of transistor 36. This causes transistor 36 to be conductive and provide a logic low to high voltage logic circuit 34.

For signal Vin switching to a logic low, inverter 12 responds by providing a VL logic high to inverter 14, the source of transistor 20, and the gate of transistor 22. Inverter 14 responds by providing a logic low at ground to the source of transistor 22 and the gate of transistor 20. The result is that transistor 22 is conductive and transistor 20 is ensured of being non-conductive because of the gate to source negative bias. With transistor 22 conductive and transistor 20 non-conductive, transistor 16 becomes conductive to raise the voltage on the gate of transistor 18 reducing its conductivity. This quickly results in transistor 16 causing providing a VH logic high to the gate of transistor 18 to cause transistor to be non-conductive. With transistor 22 conductive, signal VO is provided as a logic low to transistor 36 causing transistor to be non-conductive. This is easily recognized by high voltage logic circuit 38 as a logic high.

Thus, it is seen that the near-zero threshold voltage of high voltage transistors, which can be obtained without additional processing costs beyond that required for making typical high-threshold-voltage high voltage transistors, can be beneficially used to make a level shifter. The low threshold voltage is beneficial because conduction is achieved even with low level logic highs, and the negative threshold voltage does not result in conduction with a logic low input because the source is elevated to result in a gate to source negative bias.

By now it should be appreciated that there has been provided a level shifter having first, second, third, and fourth transistors and first and second inverters. The first transistor has a first current electrode coupled to a first power supply voltage terminal, a control electrode coupled to an output terminal, and a second current electrode. The second transistor has a first current electrode coupled to the first power supply voltage terminal, a control electrode coupled to the second current electrode of the first transistor, and a second control electrode coupled to the control electrode of the first transistor. The third transistor has a first current electrode coupled to the second current electrode of the first transistor, a control electrode, and a second current electrode. The fourth transistor has a first current electrode coupled to the second current electrode of the second transistor, a control electrode coupled to the second current electrode of the third transistor, and a second current electrode coupled to the control electrode of the third transistor. The first inverter has an input terminal, and an output terminal coupled to the second current electrode of the third transistor. The second inverter has an input terminal coupled to the output terminal of the first inverter, and an output terminal coupled to the second current electrode of the fourth transistor. The first inverter may comprise a fifth transistor having a first current electrode coupled to a second power supply voltage terminal, a control electrode, and a second current electrode coupled to the second current electrode of the third transistor; and a sixth transistor having a first current electrode coupled to the second current electrode of the fifth transistor, a control electrode coupled to the control electrode of the fifth transistor, and a second current electrode coupled to a third power supply voltage terminal. The second inverter may comprise a seventh transistor having a first current electrode coupled to the second power supply voltage terminal, a control electrode coupled to the second current electrode of the fifth transistor, and a second current electrode coupled to the second current electrode of the fourth transistor, and an eighth transistor having a first current electrode coupled to the second current electrode of the seventh transistor, a control electrode coupled to the second current electrode of the fifth transistor, and a second current electrode coupled to the third power supply voltage terminal. The third and fourth transistors may be N channel transistors, and wherein the third and fourth N channel transistors may be characterized as having a substantially zero threshold voltage. The first, second, third, and fourth transistors may have a substantially thicker gate oxide than the fifth, sixth, seventh, and eighth transistors. The first power supply voltage provided to the first power supply voltage terminal may be substantially higher than a second power supply voltage provided to the second power supply voltage terminal, and the third power supply voltage terminal may be coupled to ground. The output terminal of the level shifter circuit may be coupled to a fifth transistor, the third, fourth, and fifth transistors may be N channel transistors, and the third and fourth transistors may have a substantially lower threshold voltage than the fifth transistor. The first and second transistors are P channel transistors.

Also described is a level shifter having first, second, third, fourth, fifth, sixth, seventh, and eighth transistors. The first transistor has a first current electrode coupled to a first power supply voltage terminal, a control electrode coupled to an output terminal, and a second current electrode. The second transistor has a first current electrode coupled to the first power supply voltage terminal, a control electrode coupled to the second current electrode of the first transistor, and a second current electrode coupled to the control electrode of the first transistor. The third transistor has a first current electrode coupled to the second current electrode of the first transistor, a control electrode, and a second current electrode. The fourth transistor has a first current electrode coupled to the second current electrode of the second transistor, a control electrode coupled to the second current electrode of the third transistor, and a second current electrode coupled to the control electrode of the third transistor. The fifth transistor has a first current electrode coupled to a second power supply voltage terminal, a control electrode, and a second current electrode coupled to the second current electrode of the third transistor. The sixth transistor has a first current electrode coupled to the second current electrode of the fifth transistor, a control electrode coupled to the control electrode of the fifth transistor, and a second current electrode coupled to a third power supply voltage terminal. The seventh transistor has a first current electrode coupled to the second power supply voltage terminal, a control electrode coupled to the second current electrode of the fifth transistor, and a second current electrode coupled to the second current electrode of the fourth transistor. The eighth transistor has a first current electrode coupled to the second current electrode of the seventh transistor, a control electrode coupled to the second current electrode of the fifth transistor, and a second current electrode coupled to the third power supply voltage terminal. The first power supply voltage terminal is for receiving a first power supply voltage, the second power supply voltage terminal is for receiving a second power supply voltage, and the third power supply voltage is coupled to ground. The second power supply voltage is between ground and the first power supply voltage. The threshold voltage of each of the third and fourth transistors is lower than the second power supply voltage. The threshold voltage of each of the third and fourth transistors is substantially zero volts. The first, second, fifth, and seventh transistors are P channel transistors, and the third, fourth, sixth, and eighth transistors are N channel transistors. The first, second, third, and fourth transistors have a substantially thicker gate oxide than the fifth, sixth, seventh, and eighth transistors. The threshold voltage of each of the third and fourth transistors is in a range from −0.2 volts to +0.3 volts. The second current electrode of the second transistor is coupled to a control electrode of a ninth transistor, wherein the third, fourth, and ninth transistors are N channel transistors, and each of the third and fourth transistors have a substantially lower threshold voltage than the ninth transistor.

Further, a level shifter comprises first and second P channel transistors, first and second N channel transistors, and first and second inverters. The first P channel transistor has a first current electrode coupled to a first power supply voltage terminal, a control electrode coupled to an output terminal, and a second current electrode. The second P channel transistor has a first current electrode coupled to the first power supply voltage terminal, a control electrode coupled to the second current electrode of the first P channel transistor, and a second current electrode coupled to the control electrode of the first P channel transistor. The first N channel transistor has a first current electrode coupled to the second current electrode of the first P channel transistor, a control electrode, and a second current electrode. The second N channel transistor has a first current electrode coupled to the second current electrode of the second P channel transistor, a control electrode coupled to the second current electrode of the first N channel transistor, and a second current electrode coupled to the control electrode of the first N channel transistor. The first inverter has an input terminal, a power supply voltage terminal, and an output terminal coupled to the second current electrode of the first N channel transistor. The second inverter has an input terminal coupled to the output terminal of the first inverter, a power supply voltage terminal, and an output terminal coupled to the second current electrode of the second N channel transistor. The first power supply voltage is provided to the first power supply voltage terminal, a second power supply voltage is provided to the power supply voltage terminals of the first and second inverters, and the second power supply voltage is between the first power supply voltage and ground potential. The threshold voltage of each of the first and second N channel transistors is lower than the second power supply voltage. The threshold voltage of each of the first and second N channel transistors is substantially zero volts. The threshold voltage of each of the first and second N channel transistors is in a range of −0.2 volts to +0.3 volts. Each of the first and second inverters comprises a P channel transistor coupled in series with an N channel transistor. The P channel transistor and the N channel transistor are coupled between the power supply voltage terminals of the first and second inverters and ground. Each of the first and second P channel transistors and the first and second N channel transistors have a thicker gate dielectric than the P channel transistor and the N channel transistor of the first and second inverters.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, an N channel transistor was shown for receiving output signal VO but a P channel could also have been shown. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A level shifter circuit comprising:
   a first transistor having a first current electrode coupled to a first power supply voltage terminal, a control electrode coupled to an output terminal, and a second current electrode;
   a second transistor having a first current electrode coupled to the first power supply voltage terminal, a control electrode coupled to the second current electrode of the first transistor, and a second control electrode coupled to the control electrode of the first transistor;
   a third transistor having a first current electrode coupled to the second current electrode of the first transistor, a control electrode, and a second current electrode;
   a fourth transistor having a first current electrode coupled to the second current electrode of the second transistor, a control electrode coupled to the second current electrode of the third transistor, and a second current electrode coupled to the control electrode of the third transistor;
   a first inverter having an input terminal, and an output terminal coupled to the second current electrode of the third transistor; and a second inverter having an input terminal coupled to the output terminal of the first inverter, and an output terminal coupled to the second current electrode of the fourth transistor.

2. The level shifter circuit of claim 1, wherein the first inverter comprises:
a fifth transistor having a first current electrode coupled to a second power supply voltage terminal, a control electrode, and a second current electrode coupled to the second current electrode of the third transistor; and
a sixth transistor having a first current electrode coupled to the second current electrode of the fifth transistor, a control electrode coupled to the control electrode of the fifth transistor, and a second current electrode coupled to a third power supply voltage terminal.

3. The level shifter circuit of claim 2, wherein the second inverter comprises:
a seventh transistor having a first current electrode coupled to the second power supply voltage terminal, a control electrode coupled to the second current electrode of the fifth transistor, and a second current electrode coupled to the second current electrode of the fourth transistor, and
an eighth transistor having a first current electrode coupled to the second current electrode of the seventh transistor, a control electrode coupled to the second current electrode of the fifth transistor, and a second current electrode coupled to the third power supply voltage terminal.

4. The level shifter circuit of claim 3, wherein the third and fourth transistors are N channel transistors, and wherein the third and fourth N channel transistors are characterized as having a substantially zero threshold voltage.

5. The level shifter circuit of claim 3, wherein the first, second, third, and fourth transistors have a substantially thicker gate oxide than the fifth, sixth, seventh, and eighth transistors.

6. The level shifter circuit of claim 3, wherein a first power supply voltage provided to the first power supply voltage terminal is substantially higher than a second power supply voltage provided to the second power supply voltage terminal, and wherein the third power supply voltage terminal is coupled to ground.

7. The level shifter circuit of claim 1, wherein the output terminal of the level shifter circuit is coupled to a fifth transistor, wherein the third, fourth, and fifth transistors are N channel transistors, and wherein the third and fourth transistors have a substantially lower threshold voltage than the fifth transistor.

8. The level shifter circuit of claim 1, wherein the first and second transistors are P channel transistors.

9. A level shifter circuit comprising:
a first transistor having a first current electrode coupled to a first power supply voltage terminal, a control electrode coupled to an output terminal, and a second current electrode;
a second transistor having a first current electrode coupled to the first power supply voltage terminal, a control electrode coupled to the second current electrode of the first transistor, and a second current electrode coupled to the control electrode of the first transistor;
a third transistor having a first current electrode coupled to the second current electrode of the first transistor, a control electrode, and a second current electrode;
a fourth transistor having a first current electrode coupled to the second current electrode of the second transistor, a control electrode coupled to the second current electrode of the third transistor, and a second current electrode coupled to the control electrode of the third transistor;
a fifth transistor having a first current electrode coupled to a second power supply voltage terminal, a control electrode, and a second current electrode coupled to the second current electrode of the third transistor;
a sixth transistor having a first current electrode coupled to the second current electrode of the fifth transistor, a control electrode coupled to the control electrode of the fifth transistor, and a second current electrode coupled to a third power supply voltage terminal;
a seventh transistor having a first current electrode coupled to the second power supply voltage terminal, a control electrode coupled to the second current electrode of the fifth transistor, and a second current electrode coupled to the second current electrode of the fourth transistor, and
an eighth transistor having a first current electrode coupled to the second current electrode of the seventh transistor, a control electrode coupled to the second current electrode of the fifth transistor, and a second current electrode coupled to the third power supply voltage terminal;
wherein the first power supply voltage terminal is for receiving a first power supply voltage, the second power supply voltage terminal is for receiving a second power supply voltage, and the third power supply voltage is coupled to ground, and wherein the second power supply voltage is between ground and the first power supply voltage.

10. The level shifter circuit of claim 9, wherein a threshold voltage of each of the third and fourth transistors is lower than the second power supply voltage.

11. The level shifter circuit of claim 9, wherein a threshold voltage of each of the third and fourth transistors is substantially zero volts.

12. The level shifter circuit of claim 9, wherein the first, second, fifth, and seventh transistors are P channel transistors, and the third, fourth, sixth, and eighth transistors are N channel transistors.

13. The level shifter circuit of claim 9, wherein the first, second, third, and fourth transistors have a substantially thicker gate oxide than the fifth, sixth, seventh, and eighth transistors.

14. The level shifter circuit of claim 9, wherein a threshold voltage of each of the third and fourth transistors is in a range from −0.2 volts to +0.3 volts.

15. The level shifter circuit of claim 9, wherein the second current electrode of the second transistor is coupled to a control electrode of a ninth transistor, wherein the third, fourth, and ninth transistors are N channel transistors, and wherein each of the third and fourth transistors have a substantially lower threshold voltage than the ninth transistor.

16. A level shifter circuit comprising:
a first P channel transistor having a first current electrode coupled to a first power supply voltage terminal, a control electrode coupled to an output terminal, and a second current electrode;
a second P channel transistor having a first current electrode coupled to the first power supply voltage terminal, a control electrode coupled to the second current electrode of the first P channel transistor, and a second current electrode coupled to the control electrode of the first P channel transistor;
a first N channel transistor having a first current electrode coupled to the second current electrode of the first P channel transistor, a control electrode, and a second current electrode;

a second N channel transistor having a first current electrode coupled to the second current electrode of the second P channel transistor, a control electrode coupled to the second current electrode of the first N channel transistor, and a second current electrode coupled to the control electrode of the first N channel transistor;

a first inverter having an input terminal, a power supply voltage terminal, and an output terminal coupled to the second current electrode of the first N channel transistor; and a second inverter having an input terminal coupled to the output terminal of the first inverter, a power supply voltage terminal, and an output terminal coupled to the second current electrode of the second N channel transistor;

wherein a first power supply voltage is provided to the first power supply voltage terminal, and a second power supply voltage is provided to the power supply voltage terminals of the first and second inverters, wherein the second power supply voltage is between the first power supply voltage and ground potential.

17. The level shifter circuit of claim 16, wherein a threshold voltage of each of the first and second N channel transistors is lower than the second power supply voltage.

18. The level shifter circuit of claim 16, wherein a threshold voltage of each of the first and second N channel transistors is substantially zero volts.

19. The level shifter circuit of claim 16, wherein a threshold voltage of each of the first and second N channel transistors is in a range of −0.2 volts to +0.3 volts.

20. The level shifter circuit of claim 16, wherein each of the first and second inverters comprises a P channel transistor coupled in series with an N channel transistor, wherein the P channel transistor and the N channel transistor coupled between the power supply voltage terminals of the first and second inverters and ground, and wherein each of the first and second P channel transistors and the first and second N channel transistors have a thicker gate dielectric than the P channel transistor and the N channel transistor of the first and second inverters.

* * * * *